United States Patent
Tashiro

(10) Patent No.: US 10,901,047 B2
(45) Date of Patent: Jan. 26, 2021

(54) ELECTRIC STORAGE SYSTEM AND DETECTION METHOD OF LOOSENESS IN FASTENING PART OF ELECTRIC STORAGE SYSTEM

(71) Applicant: TOYOTA JIDOSHA KABUSHIKI KAISHA, Toyota (JP)

(72) Inventor: Hiroki Tashiro, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/251,185

(22) Filed: Jan. 18, 2019

(65) Prior Publication Data

US 2019/0235009 A1    Aug. 1, 2019

(30) Foreign Application Priority Data

Jan. 29, 2018   (JP) .................................. 2018-012807

(51) Int. Cl.
| | | |
|---|---|---|
| *G01R 31/66* | (2020.01) | |
| *H01M 10/48* | (2006.01) | |
| *H01M 2/30* | (2006.01) | |
| *G01R 19/165* | (2006.01) | |
| *G01R 31/69* | (2020.01) | |

(52) U.S. Cl.
CPC .......... *G01R 31/66* (2020.01); *G01R 19/165* (2013.01); *G01R 19/16542* (2013.01); *G01R 31/69* (2020.01); *H01M 2/30* (2013.01); *H01M 10/48* (2013.01)

(58) Field of Classification Search
CPC ...... G01R 31/66; G01R 31/69; G01R 19/165; G01R 19/16542; H01M 2/30; H01M 10/48

See application file for complete search history.

(56) References Cited

U.S. PATENT DOCUMENTS

| | | | | |
|---|---|---|---|---|
| 2003/0025481 A1* | 2/2003 | Bertness | ............. | H02J 7/00036 320/155 |
| 2011/0148426 A1* | 6/2011 | Yokotani | .......... | G01R 19/16542 324/434 |
| 2012/0007556 A1* | 1/2012 | Matsui | .................... | B60L 58/14 320/112 |

FOREIGN PATENT DOCUMENTS

| | | | | |
|---|---|---|---|---|
| JP | 3365602 B2 | 11/2002 | | |
| JP | 2011-220694 A | 11/2011 | | |
| JP | 2011220694 A | * 11/2011 | ......... | G01R 31/3842 |
| JP | 2012-019577 A | 1/2012 | | |
| JP | 2012019577 A | * 1/2012 | ............ | G01R 31/36 |
| JP | 2016-075557 A | 5/2016 | | |

* cited by examiner

*Primary Examiner* — Patrick Assouad
*Assistant Examiner* — Taqi R Nasir
(74) *Attorney, Agent, or Firm* — Sughrue Mion, PLLC

(57) ABSTRACT

The present disclosure relates to an electric storage system including an electric storage device and an electronic control unit, and to a detection method of looseness in a fastening part thereof. The electronic control unit is configured to detect electric resistance between a first terminal and a second terminal that are present in a current path of the electric storage device. The electronic control unit is also configured to detect looseness of fastening in a fastening part that is present between the first terminal and the second terminal in the current path, when a periodic variation degree of the electric resistance (for example, the number of times that a variation amount of the electric resistance that is periodically acquired exceeds a threshold) is large.

12 Claims, 9 Drawing Sheets

ELECTRIC STORAGE SYSTEM AND DETECTION METHOD OF LOOSENESS IN FASTENING PART OF ELECTRIC STORAGE SYSTEM

CROSS-REFERENCE TO RELATED APPLICATIONS

This application claims priority to Japanese Patent Application No. 2018-012807 filed on Jan. 29, 2018, which is incorporated herein by reference in its entirety.

BACKGROUND

1. Technical Field

The present disclosure relates to electric storage systems. The present disclosure more particularly relates to an electric storage system that detects looseness of fastening in a fastening part present in a current path of an electric storage device, and a method for detecting looseness in the fastening part.

2. Description of Related Art

Japanese Patent Application Publication No. 2012-019577 (JP 2012-019577 A) discloses an electric storage system that detects looseness of fastening in a fastening part as described above, when the fastening part has an increased electric resistance. The electric storage system measures contact resistance of the fastening part with use of a voltage sensor and a current sensor, calculates the amount of increase in the contact resistance (the amount of increase from an initial state) based on the measured contact resistance, and detects the looseness of fastening based on whether or not the calculated amount of increase in the contact resistance exceeds a threshold. The contact resistance of the fastening part is electric resistance generated on a contact surface between a fastening member and a fastened object when the fastening member and the fastened object are in contact with each other. When the fastening part is loosened, the contact resistance of the fastening part increases.

SUMMARY

In the method disclosed in JP 2012-019577A, the value of electric resistance (or a parameter correlated with the value of electric resistance) exceeds a threshold when a rapid increase in electric resistance occurs due to looseness of fastening. When the electric resistance in the fastening part increases, the fastening part tends to generate heat due to electric conduction, which may promote increase in temperature around the fastening part. The electric storage system that detects looseness of fastening by the method as describe above can detect the looseness of fastening only after the electric resistance shows a rapid increase. Hence, only the components having high heat resistance can be disposed around the fastening part that can be loosened. Since the components having higher performance are more expensive, adopting the components with high heat resistance leads to increase in costs of components.

In light of the above-described problems, the present disclosure provides an electric storage system that suppresses generation of heat in a fastening part and protects the components around the fastening part by detecting looseness of fastening before a rapid increase in electric resistance of the fastening part occurs. The present disclosure also provides a method for detecting looseness of fastening in the fastening part.

Hence, one aspect of the present disclosure provides an electric storage system including an electric storage device and an electronic control unit as described below. The electronic control unit is configured as below. That is, the electronic control unit is configured to detect electric resistance between a first terminal and a second terminal that are present in a current path of the electric storage device, and the electronic control unit is configured to detect looseness of fastening in a fastening part that is present between the first terminal and the second terminal in the current path, when a periodic variation degree of the electric resistance is large.

Hereinafter, the above phrase "between the first terminal and the second terminal" may be referred to as "detection range." The detection range includes the first terminal and the second terminal. Hence, the fastening part subjected to detection of looseness may be the first terminal, or the second terminal.

A variation amount of electric resistance may be referred to as "resistance variation amount." The above "periodic variation degree of the electric resistance" includes an amplitude and a frequency of the periodic variation of the electric resistance, and parameters correlated with the amplitude and the frequency. The above "periodic variation degree of the electric resistance" may be obtained by performing periodic calculation (for example, cumulative calculation) about the resistance variation amount that is periodically acquired.

In the case where the fastening part that is present in the detection range is vibrated, the periodic variation degree of the electric resistance decreases if the contact pressure of the fastening part is sufficiently high. On the other hand, the periodic variation degree of the electric resistance increases if the contact pressure of the fastening part is not sufficiently high. The contact pressure of the fastening part is the pressure applied to a fastened object by a fastening member. For example, when the fastening part is fastened with a torque weaker than a regular torque, the fastening part has an insufficient contact pressure.

In the electric storage system, the above phenomenon that occurs when the fastening part vibrates is used to detect the looseness of fastening. In such an electric storage system, it becomes possible to detect looseness of fastening before a rapid increase in the electric resistance (that is, while the electric resistance is low). It also becomes possible to suppress generation of heat in the fastening part (by extension, temperature increase around the fastening part) by suppressing increase in the electric resistance in the fastening part. Thus, the components around the fastening part can be protected.

In the electric storage system, the electronic control unit may be configured to determine that the periodic variation degree is large, when the number of times that the resistance variation amount that is periodically acquired exceeds a first threshold is larger than a second threshold. The electronic control unit may also be configured to determine that the periodic variation degree is large, when an integrated value of the resistance variation amount that is periodically acquired exceeds a threshold.

Even when no looseness of fastening occurs, an electric resistance value may exceed a specified value due to disturbance (noise, or the like). Hence, in the method of detecting looseness of fastening when the electric resistance in the fastening part increases, erroneous detection tends to occur. In contrast to this, the above-configured electric storage system determines whether or not the periodic variation degree is large (by extension, whether or not looseness of fastening occurs) with use of a cumulative calculation value (the number of times or an integrated value). Such a variation singly occurs even when the electric resistance widely varies due to disturbance, and therefore the cumulative calculation value is hardly influenced by the disturbance. Accordingly, performing the above-stated determination allows proper detection of the looseness of fastening. Although a period of time (hereinafter refer to as "detection period") in which the number of time or the integrated value is cumulatively calculated (counted or integrated) can be set to any period, the detection period is preferably ten seconds or more and one minute or less. For example, whenever the detection period expires, the number of times (counted value) or the integrated value may be reset.

In the electric storage system, the electronic control unit may be configured to detect the electric resistance with use of an output of a voltage sensor and an output of a current sensor. The voltage sensor may detect an inter-terminal voltage between the first terminal and the second terminal. The current sensor may detect a current flowing between the first terminal and the second terminal. The variation amount of the electric resistance may be a difference between electric resistance detected at a previous time and electric resistance detected at a present time. The variation amount of the electric resistance may be a ratio between electric resistance detected at a previous time and electric resistance detected at a present time. The variation amount is larger, as the difference (absolute value) is larger. The variation amount is smaller, as the ratio is closer to one.

According to the configuration of the electric storage system as described above, it becomes possible to determine the electric resistance between the first terminal and the second terminal and the variation amount of the electric resistance easily and appropriately. A voltage sensor and a current sensor that are used for charge and discharge control of the electric storage device may be used as the aforementioned voltage sensor and current sensor (sensor for detecting the electric resistance between terminals).

In the electric storage system, the first terminal and the second terminal may electrically be connected with each other through one conductive member (for example, a metal plate). The first terminal and the second terminal may each be fixed to each of the conductive members by a fastening member (for example, a metal screw).

In the above-configured electric storage system, the electronic control unit detects looseness of fastening in at least one of the first terminal and the second terminal. Accordingly, it becomes easy to identify a loosened point. Since only one conductive member is present between the first terminal and the second terminal, it is less likely that the electric resistance between the first terminal and the second terminal varies due to factors other than the aforementioned looseness of fastening. Hence, it becomes easy for the electronic control unit to detect a very small variation of the electric resistance attributed to the looseness of fastening.

In the electric storage system, the electric storage device may include an assembled battery including a plurality of cells. In at least one of the first terminal and the second terminal, a positive electrode or a negative electrode of each of the cells and each of the conductive members (for example, bus bars) may be fastened by each of fastening members.

In a large-capacity assembled battery, a large number of cells are electrically connected, and the electric connection requires use of many conductive members. Such conductive members are fixed to the terminals (positive electrode terminals or negative electrode terminals) of the cells by the fastening members. The electric storage system having the above configuration is allowed to detect the looseness of fastening of such conductive members easily and appropriately. For example, a looseness detection unit may detect looseness of fastening in the conductive members that electrically connect between cells in the assembled battery. The conductive member may electrically connect the positive electrode of a first cell and the negative electrode of a second cell. The looseness detection unit may detect the looseness of fastening in the conductive members that electrically connect between cell trains (also referred to as "stacks") in an assembled battery.

In at least one of the first terminal and the second terminal in the electric storage system, a first conductive member and a second conductive member that are included in the electric storage device may be fastened by the fastening member.

A long conductive member is formed by connecting the first conductive member and the second conductive member. The conductive member tends to vibrate more, as the conductive member is longer. The electric storage system having the above configuration can properly detect the looseness of fastening in the conductive member with use of the vibration of the conductive member. When a large periodic variation degree of the electric resistance is caused by vibration of the conductive member, the looseness of fastening is detected.

In the electric storage system, the electronic control unit may be configured to perform at least one of notifying occurrence of the looseness of fastening, recording occurrence of the looseness of fastening, and current limiting in the electric storage device, when detecting the looseness of fastening.

According to the electric storage system, when the looseness of fastening occurs, a user can take a measure at an early stage. For example, the aforementioned notifying or recording enables the user to know that the looseness of fastening occurs. Thus, the user can increase the contact pressure of the fastening member by fastening the fastening part (fastening part in which the contact pressure of the fastening member is lowered) with a regular torque. It also becomes possible to suppress generation of heat in the fastening part (by extension, temperature increase around the fastening part) by limiting the current in the electric storage device. Thus, the components around the fastening part can be protected.

The electric storage system may be mount on a vehicle. In the electric storage system, the periodic variation of the electric resistance may be generated by vibration of the vehicle.

When the vehicle vibrates during traveling, the fastening part may be loosened by a load from a road surface (what is called a road surface input) applied to the fastening part. However, the electric storage system having the above configuration can properly detect the looseness of fastening by using such vehicle vibration. When a large periodic variation degree of the electric resistance is generated by vehicle vibration, looseness of fastening is detected.

According to another aspect of the present disclosure, a detection method of looseness in a fastening part of an electric storage system is provided as below. The electric storage system includes an electric storage device having: a first terminal and a second terminal that are present in a current path of the electric storage device; and a fastening part between the first terminal and the second terminal. The detection method is as described below. That is, the detection method includes: detecting electric resistance between the first terminal and the second terminal; and detecting looseness of fastening in the fastening part when a periodic variation degree of the electric resistance is large.

According to the present disclosure, it becomes possible to detect looseness of fastening before a rapid increase in the electric resistance in a fastening part, and to thereby suppress generation of heat in a fastening part. According to the present disclosure, instead of or in addition to the above effect, there is demonstrated an effect that the components around the fastening part are allowed to be protected.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
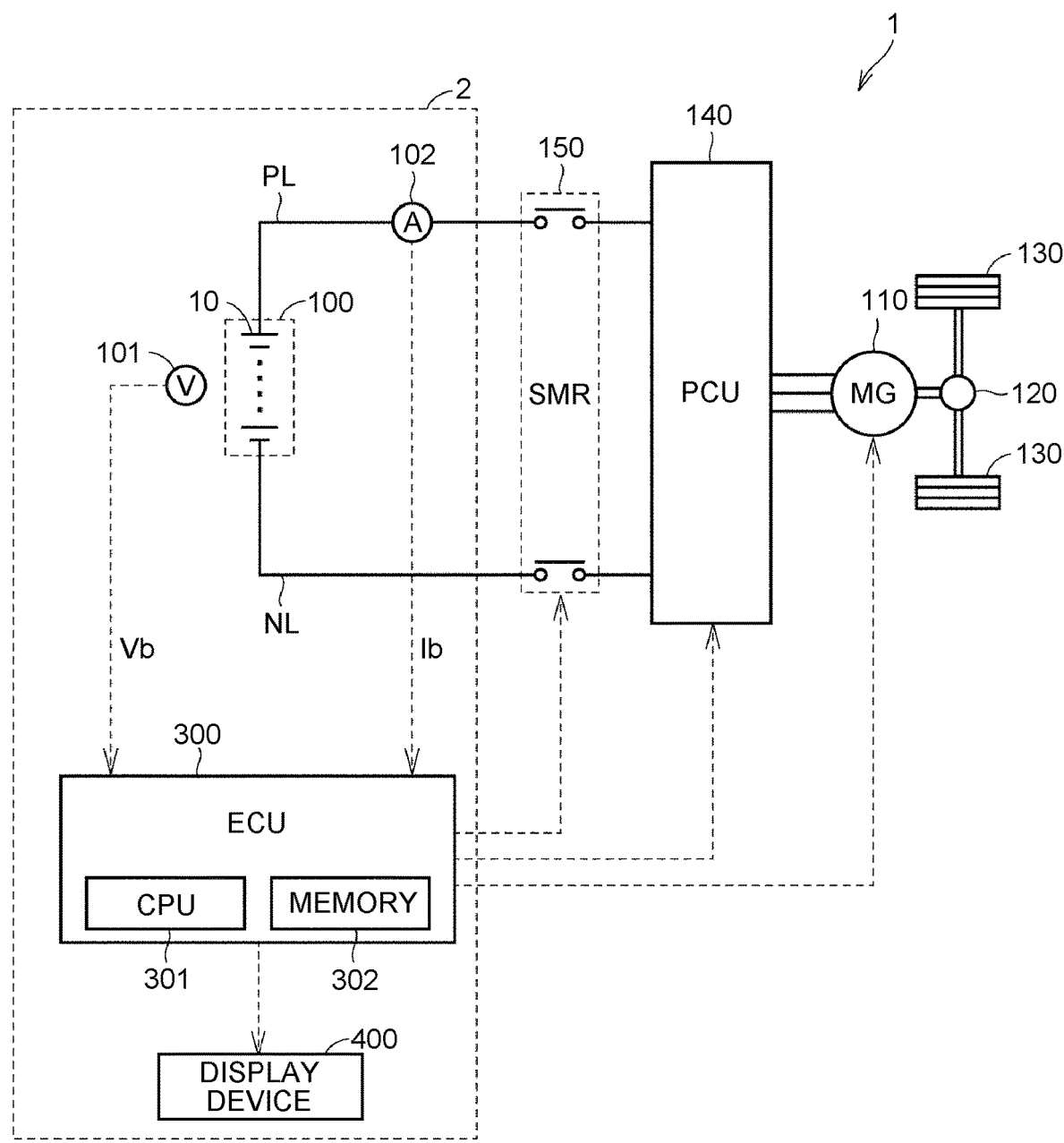
FIG. 1 schematically shows the overall configuration of a vehicle mounted with an electric storage system according to a first embodiment of the present disclosure.

Hereinbelow, embodiments of the present disclosure will be described in detail with reference to the drawings. Note that identical or like component members are designated by identical reference numerals to avoid repetition of the description thereof.

Hereinafter, an example of applying an electric storage system to an electric vehicle will be described. However, the electric storage system may be applied not only to the electric vehicle, but also to a hybrid vehicle. The electric storage system may also be applied not only as the system for vehicles but also as the system used in a stationary environment.

First, a first embodiment will be described. FIG. 1 is a block diagram schematically showing the overall configuration of a vehicle 1 mounted with an electric storage system according to the first embodiment.

With reference to FIG. 1, the vehicle 1 includes a motor generator (hereinafter, referred to as "motor generator (MG)") 110, a power transmission gear 120, driving wheels 130, a power control unit (hereinafter referred to as "power control unit (PCU)") 140, a system main relay (hereinafter referred to as "system main relay (SMR)") 150, and an electric storage system 2. The electric storage system 2 includes an assembled battery 100, a voltage sensor 101, a current sensor 102, an electronic control unit (hereinafter referred to as "electronic control unit (ECU)") 300, and a display device 400. The assembled battery 100 according to the first embodiment corresponds to one example of "electric storage device" according to the present disclosure. The assembled battery 100 has a positive electrode terminal connected to an electric power line PL, and a negative electrode terminal connected to an electric power line NL.

For example, the MG 110 is a three-phase alternate current rotary electric machine. The output torque of the MG 110 is delivered to the driving wheels 130 through the power transmission gear 120 constituted of a reducer, or the like. The MG 110 can also generate electric power by a turning effect of the driving wheels 130 at the time of regenerative braking operation of the vehicle 1. A hybrid vehicle, mounted with an engine (not shown) in addition to the MG 110, generates vehicle driving power by operating the engine and the MG 110 in cooperation. Although the configuration including only one MG is shown in FIG. 1, the number of MGs is not limited to one. The configuration including a plurality of (for example, two) MGs may be adopted.

The PCU 140 includes an inverter and a converter (both the components not shown). When the assembled battery 100 is discharged, the converter boosts a voltage supplied from the assembled battery 100, and supplies the boosted voltage to the inverter. The inverter converts direct-current electric power supplied from the converter into alternating-current electric power for driving of the MG 110. When the assembled battery 100 is charged, the inverter converts the alternating-current electric power generated by the MG 110 into direct-current electric power, and supplies the converted electric power to the converter. The converter steps down a voltage supplied from the inverter, and supplied the stepped-down voltage to the assembled battery 100.

The SMR 150 is electrically connected to a current path that connects between the assembled battery 100 and the PCU 140. When the SMR 150 is closed in response to a control signal from the ECU 300 (note: "close" means "turn-on"), electric power may be transferred between the assembled battery 100 and the PCU 140.

The assembled battery 100 is a direct-current power supply configured to be rechargeable. The assembled battery 100 includes a plurality of secondary batteries. In the first embodiment, the assembled battery 100 is constituted of a plurality of non-aqueous electrolyte secondary batteries (specifically, lithium ion batteries) connected in series. Hereinafter, the secondary batteries (lithium ion batteries in the first embodiment) that constitute the assembled battery 100 are referred to as "cells."

Figure 2:
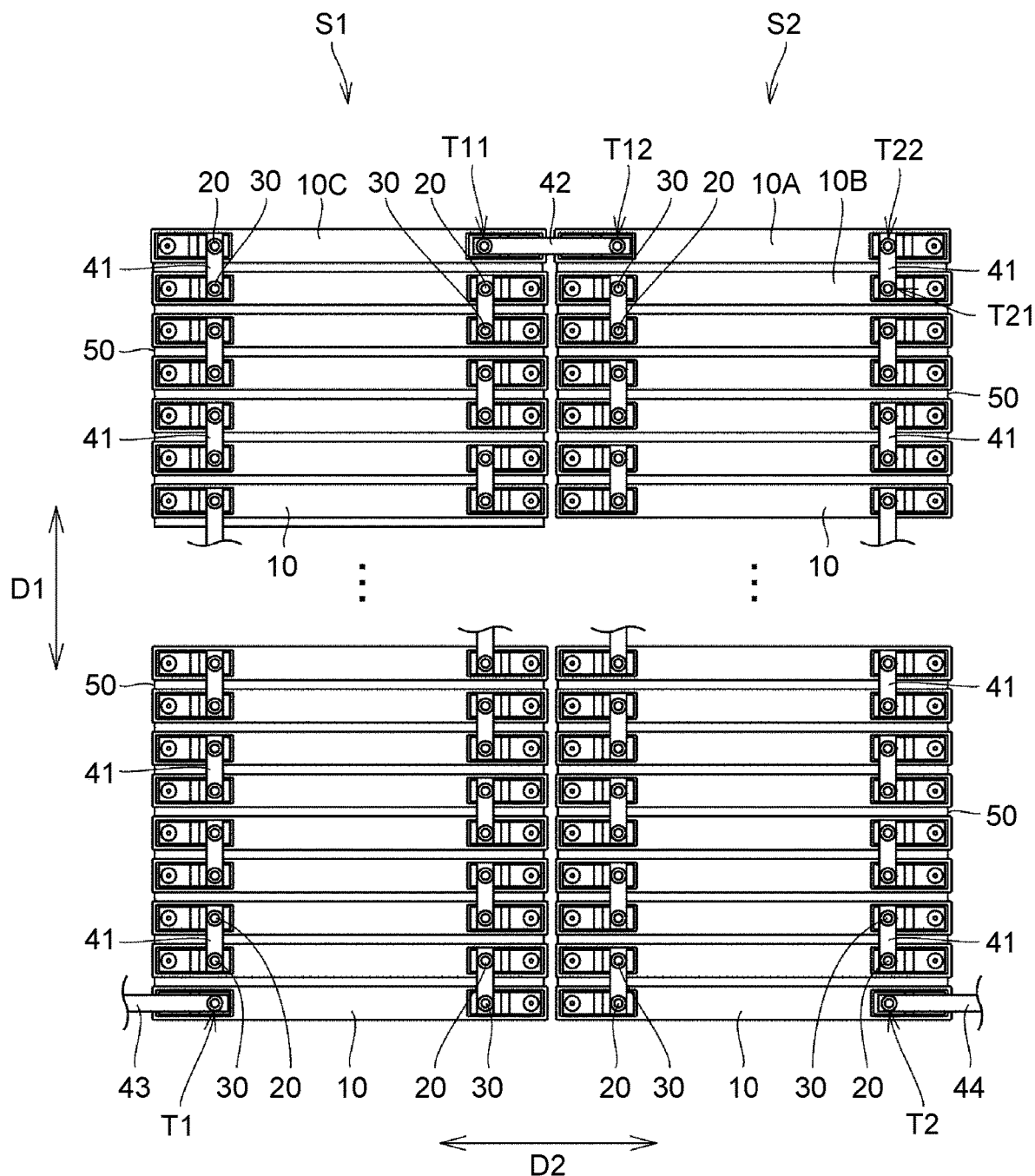
FIG. 2 shows a connection mode of cells in an assembled battery shown in FIG. 1.
Figure 3:
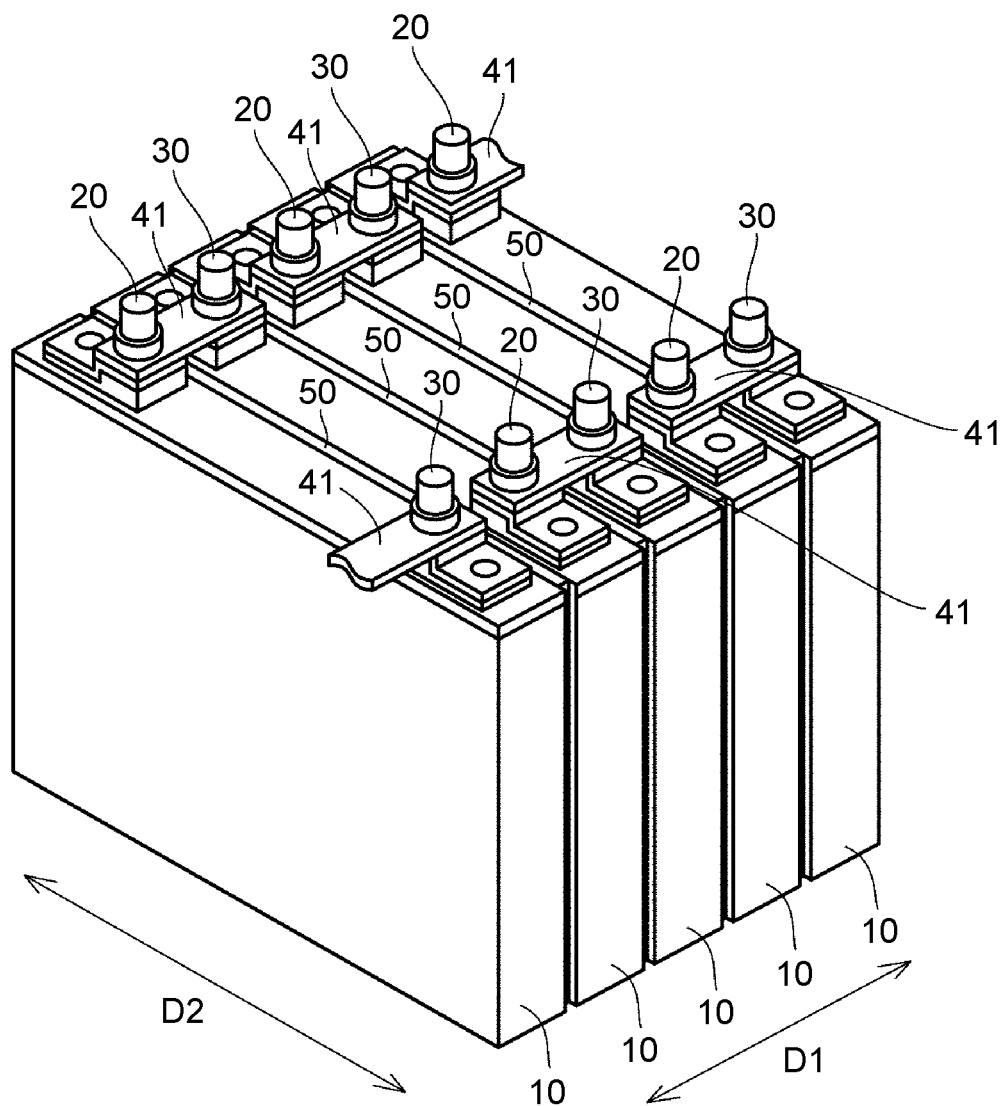
FIG. 3 is a perspective view showing some of stacks that constitute the assembled battery shown in FIG. 2.

FIG. 2 shows a connection mode of the cells 10 in the assembled battery 100. FIG. 3 is a perspective view showing some of stacks that constitute the assembled battery 100. In FIGS. 2 and 3, an array direction D1 represents the direction of arraying the cells 10 that constitute a stack, and a width direction D2 represents a direction orthogonal to the array direction D1. Hereinafter, some of the cells 10 that constitute the assembled battery 100 are also referred to as cells 10A, 10B, 10C. The cells 10A to 10C are the cells 10 disposed at positions shown in FIG. 2.

With reference to FIG. 2, the assembled battery 100 includes stacks S1, S2. The stacks S1, S2 are constituted of the cells 10 lined in the array direction D1. In each of the stacks, the cells 10 are electrically connected with each other through bus bars 41. For example, a terminal T21 that is a negative electrode terminal 20 of the cell 10B is electrically connected with a terminal T22 that is a positive electrode terminal 30 of the cell 10A by the bus bar 41. A positive electrode terminal T11 of the stack S1 that is a positive electrode terminal 30 of the cell 10C, and a negative electrode terminal T12 of the stack S2 that is a negative electrode terminal 20 of the cell 10A, are electrically connected with each other through a bus bar 42. The negative electrode terminal T1 of the stack S1 corresponds to the negative electrode terminal of the assembled battery 100, and the positive electrode terminal T2 of the stack S2 corresponds to the positive electrode terminal of the assembled battery 100. A bus bar 43 fastened to the negative electrode terminal T1 of the stack S1 constitutes part of the electric power line NL (FIG. 1), and a bus bar 44 fastened to the positive electrode terminal T2 of the stack S2 constitutes part of the electric power line PL (FIG. 1).

With reference to FIG. 3, the stacks that constitute the assembled battery 100 are each constituted of the cells 10 and a plurality of spacers 50 such that the cells 10 and the spacers 50 are each alternately laminated in the array direction D1. The spacers 50 are disposed between the cells 10, respectively. The spacers 50 are made of resin, for example.

The cells 10 each include the negative electrode terminal 20 and the positive electrode terminal 30. The cells 10 are electrically connected in series. Specifically, the cells 10 that constitute the assembled battery 100 are arrayed with their directions alternately reversed. The negative electrode terminal 20 of one cell 10 is electrically connected with the positive electrode terminal 30 of another adjacent cell 10 by the bus bar 41. The number of the cells 10 may properly be changed depending on a required output of the assembled battery 100, or the like.

The bus bars 41 to 44 are each a conductive member. As the bus bars 41 to 44, metal plates generally used in an independent manner as a connecting member between electrode terminals may be adopted. Examples of the plate members may include flat plate members made of iron, copper, or an alloy containing at least one of iron and copper.

Figure 4:
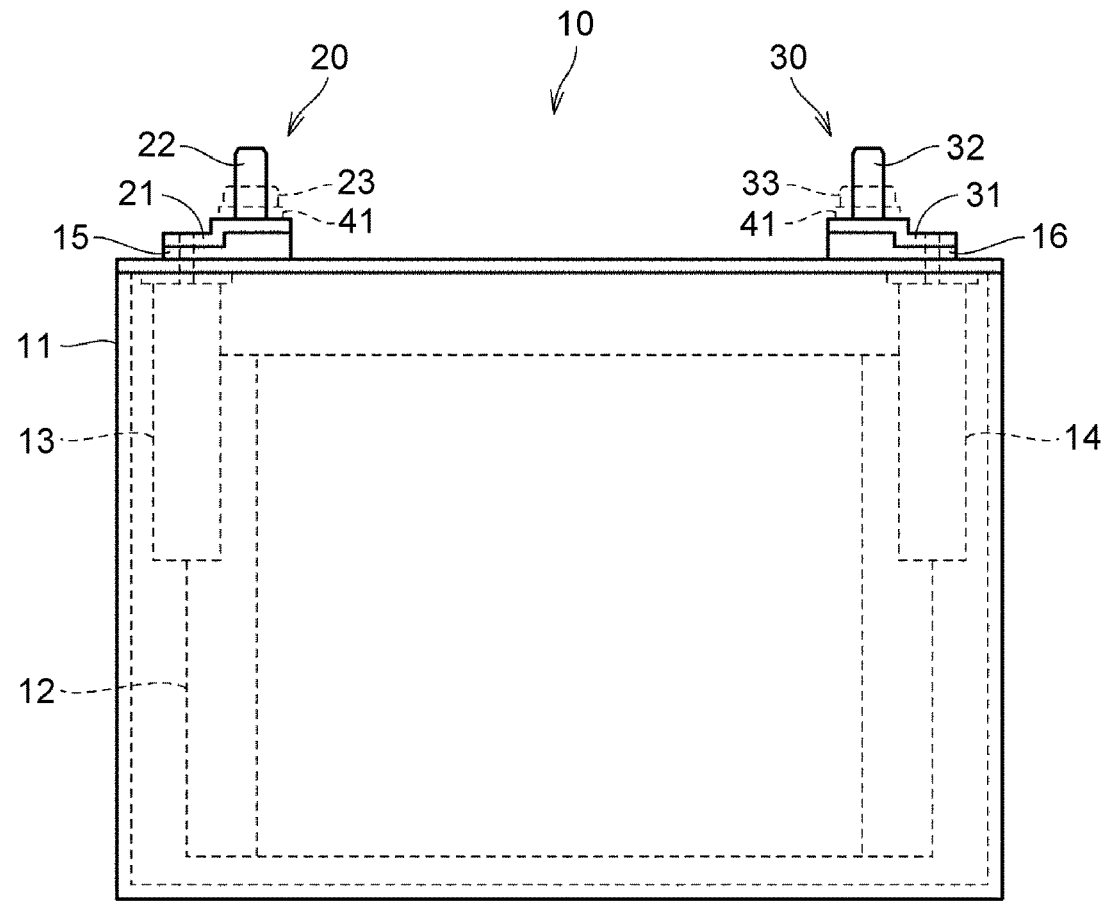
FIG. 4 shows the configuration of a cell shown in FIG. 3.

FIG. 4 shows the configuration of the cells 10. Since each of the cells 10 has the same configuration, one cell 10 is typically shown in FIG. 4.

With reference to FIG. 4, the cell 10 includes a metal case 11. Contained in the case 11 are an electrode body 12 and electrolytic solution (not shown) that constitute a lithium ion battery. A gas release valve (not shown) is also provided on an upper side of the case 11.

On the outer side of the case 11, the negative electrode terminal 20 and the positive electrode terminal 30 of the cell 10 are fixed to the case 11 by a negative electrode collecting terminal 13 and a positive electrode collecting terminal 14, which are described later. The negative electrode terminal 20 includes a pedestal 21, a bolt 22, and a nut 23. The positive electrode terminal 30 includes a pedestal 31, a bolt 32, and a nut 33. A gasket 15 is provided between the case 11 and the negative electrode terminal 20, and a gasket 16 is provided between the case 11 and the positive electrode terminal 30.

The pedestals 21, 31 are each a conductive member (for example, metal member). Examples of the pedestals 21, 31 may include a metal member made of aluminum, iron, and copper, or an alloy containing at least one of aluminum, iron, and copper.

The bolts 22, 32 and the nuts 23, 33 are each a fastening member used in order to fasten the negative electrode terminal 20, the positive electrode terminal 30, and the bus bars (for example, bus bar 41). Bolts and nuts generally used as a fastening member may be adopted as the bolts 22, 32 and the nuts 23, 33. Examples of such bolts and nuts may include galvanized iron bolts and nuts.

The bolts 22, 32 include head parts each embedded in the gaskets 15, 16, and screwing parts each having a screw thread on the external surface (only the screwing part is shown in FIG. 4). The pedestals 21, 31 and the bus bar 41 can be fastened by screwing screw threads formed on the inner surfaces of the nuts 23, 33 and the screw threads of the screwing parts of the bolts 22, 32. Although a fastening part having the bus bar 41 fastened by the fastening members (bolts and nuts) are shown in FIG. 4, the bus bar 42 is fastened by the fastening members (bolts and nuts) in the positive electrode terminal 30 of the cell 10C (positive electrode terminal T11 of the stack S1), and the negative electrode terminal 20 of the cell 10A (negative electrode terminal T12 of the stack S2).

In the inner side of the case 11, the electrode body 12 includes a positive electrode plate, a separator, and a negative electrode plate. The positive electrode plate includes a positive electrode collector (for example, aluminum foil) and a positive-electrode active material (for example, lithium transition metal oxide). The negative electrode plate includes a negative electrode collector (for example, copper foil) and a negative-electrode active material (for example, carbon-based material). The separator is a resin layer disposed between the positive electrode plate and the negative electrode plate.

The negative electrode plate and the positive electrode plate of the electrode body 12 are connected to the negative electrode collecting terminal 13 and the positive electrode collecting terminal 14, respectively. Each of the negative electrode collecting terminal 13 and the positive electrode collecting terminal 14 has a protruding portion (caulking part) protruding toward the top of the case 11 from the inner side of the case 11. The negative electrode collecting terminal 13 and the positive electrode collecting terminal 14 protrude outward from the case 11 so as to penetrate the gaskets 15, 16 and the pedestals 21, 31, and to be caulked on the upper surface of the pedestals 21, 31. Thus, the gaskets 15, 16 and the pedestals 21, 31 are fixed to the upper surface of the case 11.

With reference to FIG. 1 again, the voltage sensor 101 detects a voltage between specified terminals in a current path of the assembled battery 100, and outputs a voltage detection value Vb to the ECU 300. The current sensor 102 detects a current input to and output from the assembled battery 100, and outputs a current detection value Ib to the ECU 300. In the first embodiment, the voltage sensor 101 is provided such that an inter-terminal voltage between the terminal T21 and the terminal T22 shown in FIG. 2 can be detected. In the terminal T21 and the terminal T22, the detection terminals of the voltage sensor 101 are connected such that electric resistance correlated with contact resistance of the fastening part (for example, electric resistance including the contact resistance of the fastening part) is detected. The current sensor 102 is provided such that the current flowing between the terminal T21 and the terminal T22 can be detected. Although the current directly measured by the current sensor 102 is a current flowing through the electric power line PL, the current flowing between the terminal T21 and the terminal T22 can be detected by the current sensor 102, since the current flowing through the electric power line PL coincides with the current between the terminals T21, T22.

A battery voltage (cell voltage, or the like) and a battery current, used for the charge and discharge control of the assembled battery 100, may be detected by the voltage sensor 101 and the current sensor 102, respectively. Such a battery voltage and a battery current are used in order to measure a state of charge (SOC) of the assembled battery 100, for example. The SOC is defined as a ratio (for example, a percentage) of charging capacity at a current time to full-charge capacity. As a measuring method of the SOC, various publicly-known methods, such as a method using a current value integration (coulomb count) or a method involving estimation of an open circuit voltage (OCV), is adoptable.

In order to detect the battery voltage used for the charge and discharge control of the assembled battery 100, a voltage sensor different from the voltage sensor 101 may be added. The number of the voltage sensors provided in the assembled battery 100 can optionally be changed. One voltage sensor may be provided for every cell, one voltage sensor may be provided for each group of cells, or only one voltage sensor may be provided for one assembled battery.

The ECU 300 includes a central processing unit (CPU) 301, a memory 302, and an input-output buffer that is not shown. The memory 302 includes a read only memory (ROM), a random access memory (RAM), and a rewritable nonvolatile memory. Various control processes are executed when the CPU 301 executes programs stored in the memory 302 (for example, the ROM). The ECU 300 controls each device such that the vehicle 1 and the electric storage system 2 are in a desired state based on signals received from each sensor, and on maps and programs stored in the memory 302. The various control processes performed by the ECU 300 may be implemented not only by software, but also by dedicated hardware (electronic circuit).

In the ECU 300, the CPU 301 outputs acquired information (such as a calculation result) to the memory 302 (for example, a rewritable nonvolatile memory), and stores the information in the memory 302. The memory 302 may pre-store the information (such as thresholds) used for travel control of the vehicle 1, charge and discharge control of the assembled battery 100, and a process for detecting looseness of fastening described later.

The display device 400 is a device that displays information and signals input from the ECU 300. The display device 400 is installed at a visually recognizable position by the user who sits on a driver seat (not shown) of the vehicle 1. The display device 400 includes a display that displays a variety of pieces of information. The display may be a display unit of a meter panel, or may be a display unit of an on-board car-navigation system. The display may include a speaker function. A communication system between the ECU 300 and the display device 400 may be a wired or wireless communication system.

Incidentally, a plurality of fastening parts are present in the current path of the assembled battery 100. For example, the terminals and the conductive members (the bus bars 41 or 42) of the cells 10 are fastened by the fastening members (bolts and nuts). In such fastening parts, when a fastening torque is insufficient, the vehicle 1 during traveling vibrates, with the result that a load from the road surface (what is called a road surface input) may be applied to the fastening parts, resulting in looseness of fastening.

Figure 5:
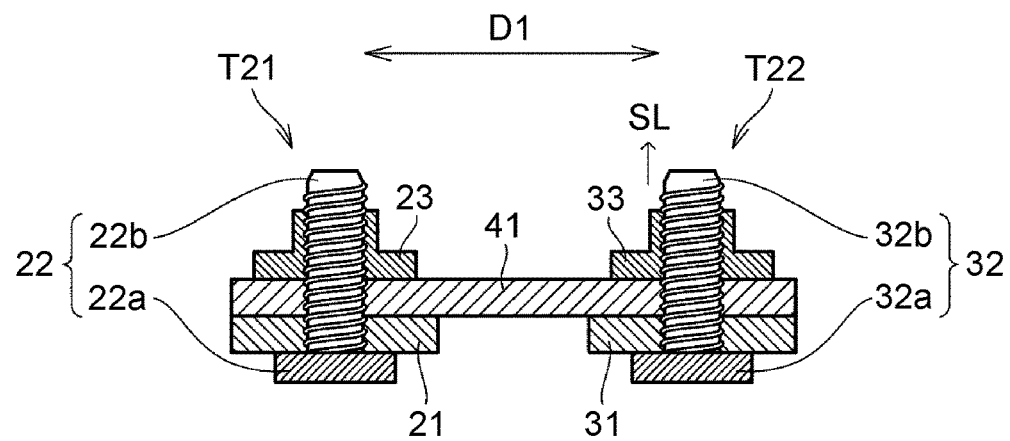
FIG. 5 shows two fastening parts that are present in a current path of the assembled battery shown in FIG. 2.

FIG. 5 shows two fastening parts (terminals T21, T22 shown in FIG. 2) that are present in the current path of the assembled battery 100. In FIG. 5, the gaskets 15, 16 are omitted, and head parts 22a, 32a of the bolts that are present inside the gaskets are illustrated.

With reference to FIG. 5, the terminal T21 (negative electrode terminal 20 of the cell 10B) and the terminal T22 (positive electrode terminal 30 of the cell 10A) are electrically connected with each other through one conductive member (bus bar 41). The bus bar 41 is fixed to each of the terminal T21 and the terminal T22 by the fastening members (bolts 22, 32 and nuts 23, 33).

In the terminal T21, the pedestal 21 (negative electrode of the cell 10) and the bus bar 41 are fastened by the bolt 22 and the nut 23. The bolt 22 includes the head part 22a and the screwing part 22b. The screwing part 22b is inserted into a through-hole formed in each of the pedestal 21 and the bus bar 41 such that the pedestal 21 and the bus bar 41 are interposed between the head part 22a and the nut 23. The detection terminals (not shown) of the voltage sensor 101 may each be interposed between the bus bar 41 and the nut 23 so as to be in contact with the bus bar 41.

In the terminal T22, the pedestal 31 (positive electrode of the cell 10) and the bus bar 41 are fastened by the bolt 32 and the nut 33. The bolt 32 includes the head part 32a and the screwing part 32b. The screwing part 32b is inserted into a through-hole formed in each of the pedestal 31 and the bus bar 41 such that the pedestal 31 and the bus bar 41 are interposed between the head part 32a and the nut 33. The detection terminals (not shown) of the voltage sensor 101 may each be interposed between the bus bar 41 and the nut 33 so as to be in contact with the bus bar 41.

For example, when the terminal T22 fastened by the fastening members (the bolt 32 and the nut 33) is loosened, the nut 33, in which the screwing part 32b is screwed, move in a direction shown by an arrow SL (direction away from the bus bar 41). As a result, the contact pressure of the fastening part is lowered. The contact pressure of the fastening part is the pressure applied to the pedestal 31 and the bus bar 41 by the bolt 32 and the nut 33.

Figure 6:
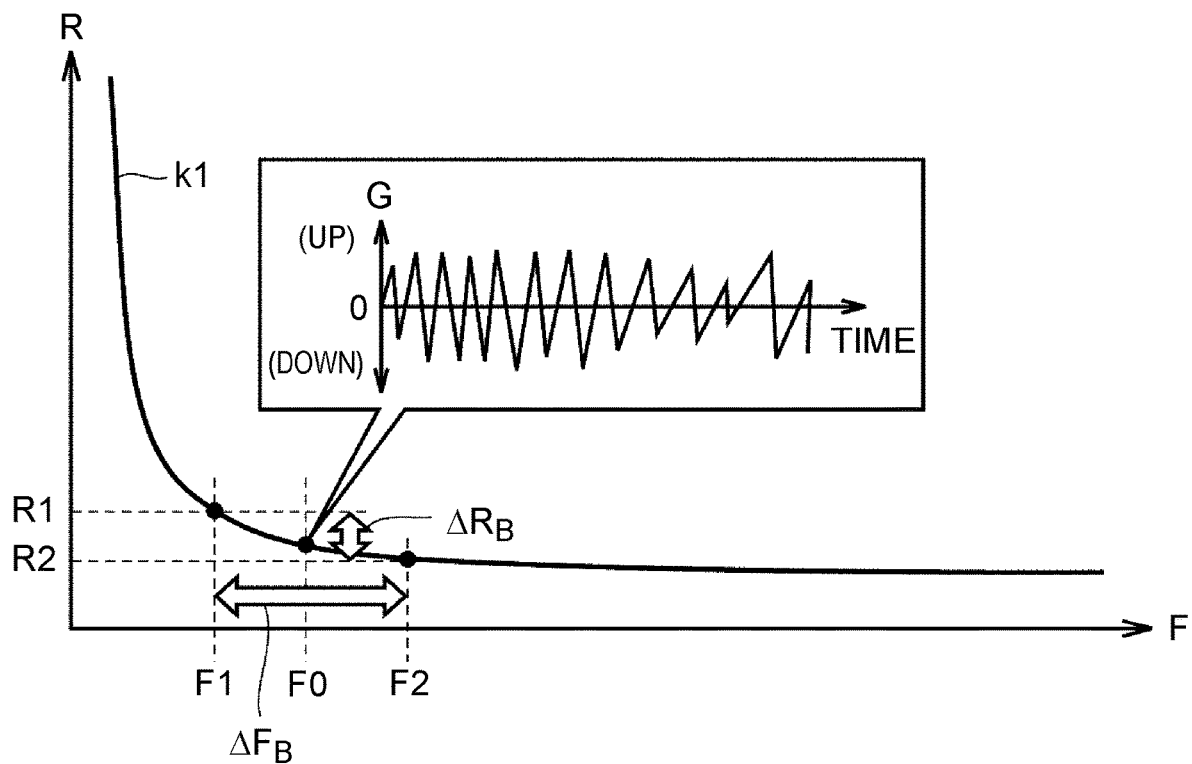
FIG. 6 shows a relation between contact pressure and contact resistance.

FIG. 6 shows a relation between a contact pressure F (horizontal axis) and a contact resistance R (vertical axis). The contact pressure increases more, as the load applied to the contact surface is larger. A line k1 in FIG. 6 represents data that is obtained by placing a weight on a bus bar (metal plate) and measuring electric resistance (contact resistance) between the bus bar and the weight. The contact pressure (pressure applied to the bus bar by the weight) is adjusted by changing the weight (load).

With reference to FIG. 6, in a region where the contact pressure is larger than a pressure value F2, the contact resistance is stable, and even with a variation of the contact pressure, the contact resistance hardly changes, as shown by the line k1. On the other hand, when the contact pressure is gradually decreased from a reference value F0 (contact pressure corresponding to a load of 5 N), a rapid increase in the contact resistance occurs at a pressure value F1.

In a fastening part included in the assembled battery 100, the relation between the contact pressure and the contact resistance is the same as the above-stated relation. That is, as fastening by the fastening members is weaker, the load provided by the fastening members (by extension, the contact pressure of the fastening parts) is lowered. Consequently, when the looseness of fastening occurs and the contact pressure decreases, the electric resistance of the fastening part rapidly increases. Such increase in the electric resistance in the fastening part leads to generation of heat in the fastening part (by extension, temperature increase around the fastening part).

With the configuration described below, the electric storage system 2 according to the first embodiment makes it possible to detect the looseness of fastening and suppress generation of heat in the fastening part before the electric resistance of the fastening part rapidly increases.

The ECU 300, a portion of the ECU 300 that functions as a resistance detection unit in particular, is configured to detect the electric resistance between the terminal T21 (first terminal) and the terminal T22 (second terminal) that are present in the current path of the assembled battery 100. When the electric resistance has a large periodic variation degree (a later-described count value $C_B$ in the first embodiment), the ECU 300, a portion of the ECU 300 that functions as a resistance detection unit in particular, is configured so as to detect looseness of fastening in the fastening parts (terminals T21, T22) that are present in a detection range in the current path of the assembled battery 100. In the first embodiment, the region between the terminal T21 and the terminals T22 corresponds to the detection range.

Hereinafter, the principle of the detection of looseness of fastening will be described with FIG. 6. With reference to FIG. 6, when the vehicle 1 vibrates, a fastening part included in the assembled battery 100 receives force in up-down direction (vertical direction) corresponding to the vibration. FIG. 6 includes a graph that shows a relation between load (vertical axis G) applied to the fastening part in the vehicle 1 that is traveling while vibrating and time (horizontal axis). As is shown in the graph, the direction of the force (load) applied to the fastening part periodically changes such that the fastening part receives upward force and downward force in an alternate manner.

For example, when the above load is applied to a fastening part while the contact pressure of the fastening part is equal to the reference value F0, the contact pressure of the fastening part periodically varies in a range (range $\Delta F_B$) from the pressure value F1 to the pressure value F2 in response to the periodic variation of the load. In response to such a periodic variation of the contact pressure, the electric resistance of the fastening part periodically varies in a range (range $\Delta R_B$) from a resistance value R1 to a resistance value R2.

The ECU 300 detects the periodic variation degree (hereinafter, also referred to as "periodic variation parameter") of the electric resistance as described above. When the looseness of fastening occurs, the periodic variation parameter of the fastening part increases. Using such a relation, the ECU 300 detects the looseness of fastening in the fastening parts (terminals T21, T22), when the detected periodic variation parameter is large. When the periodic variation parameter is large, it means that the looseness of fastening occurs in at least one of the terminals T21, T22.

Figure 7:
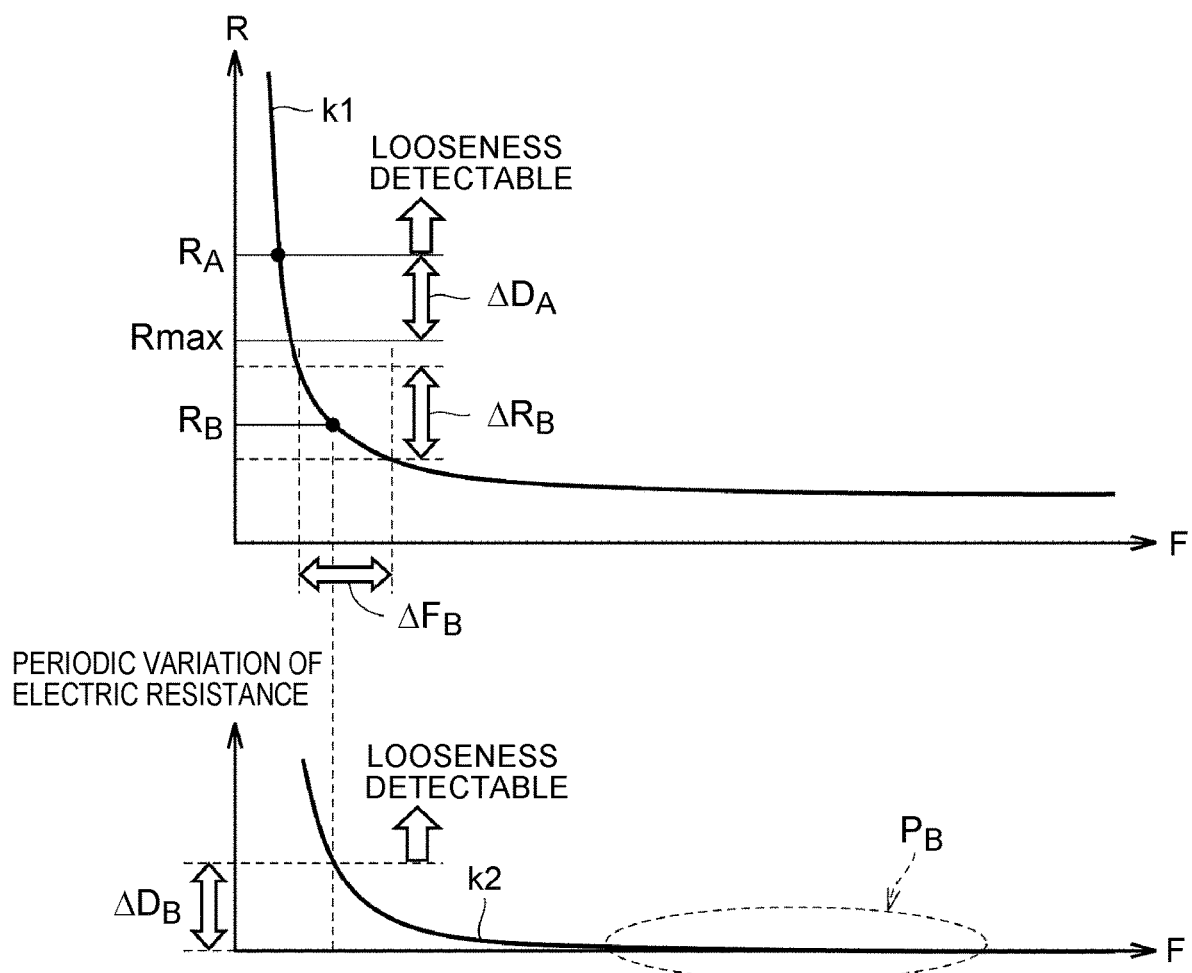
FIG. 7 is an explanatory view showing a detection method of looseness of fastening in the electric storage system according to the first embodiment of the present disclosure.

Next, the above detection method of looseness of fastening (hereinafter, referred to as "resistance variation method") by the ECU 300 will be described in comparison with a method of detecting looseness of fastening when the electric resistance of a fastening part increases (hereinafter, referred to as "resistance value method"). FIG. 7 is an explanatory view of the resistance variation method. In FIG. 7, a line k1 is the same as the line k1 in FIG. 6, which represents the relation between contact pressure (horizontal axis F) and contact resistance (vertical axis R). A line k2 represents a relation between contact pressure (horizontal axis F) and a periodic variation parameter (vertical axis: periodic variation of electric resistance). An error $\Delta D_A$ represents the magnitude of a detection error in the resistance value method, while an error $\Delta D_B$ represents the magnitude of a detection error in the resistance variation method. A resistance value $R_{max}$ represents an upper limit of the values that the electric resistance of the fastening part fastened with a regular torque can take. The electric resistance of the fastening part may increase due to deterioration of a material of the fastening part (for example, due to formation of a film), or the like.

With reference to FIG. 7, in the resistance value method, looseness of fastening is undetectable unless the electric resistance of a fastening part exceeds a resistance value $R_A$ that is higher by the error $\Delta D_A$ than the resistance value $R_{max}$. That is, in the resistance value method, looseness of fastening can be detected only after a rapid increase in the electric resistance occurs due to looseness of fastening.

In contrast, in the data represented by the line k2, the contact pressure of a fastening part fastened with a regular torque is in the range shown as a region $P_B$ in FIG. 7. Hence, even when the fastening part fastened with the regular torque is vibrated, the fastening part hardly has a periodic variation of the electric resistance. Therefore, in the resistance variation method, looseness of fastening becomes detectable when the periodic variation parameter of the fastening part becomes larger than the error $\Delta D_B$. As shown in FIG. 7, in the resistance variation method, when the electric resistance of a fastening part becomes equal to a resistance value $R_B$ that is smaller than the resistance value $R_A$, looseness of fastening becomes detectable. Thus, the resistance variation method makes it possible to detect looseness of fastening before a rapid increase in the electric resistance (that is, while the electric resistance is low). The resistance variation method also makes it possible to suppress generation of heat in the fastening part (by extension, temperature increase around the fastening part) by suppressing increase in the electric resistance in the fastening part. Thus, the components around the fastening part can be protected.

It is also conceivable to detect the looseness of fastening of the fastening part by directly measuring the contact pressure of the fastening part with use of a pressure sensor. However, such a method requires an additional pressure sensor, an additional circuit for processing signals of the pressure sensor, or other additional components, which is disadvantageous in term of cost.

In contrast, in the above-described resistance variation method, the electric resistance of a fastening part is detectable by a current sensor and a voltage sensor. Since the current sensor and the voltage sensor are used in the charge and discharge control of the assembled battery 100, it is not necessary to provide additional signal processing circuits for the sensors. The additional sensors also become unnecessary by performing charge and discharge control in the assembled battery 100 and detection of looseness of fastening with use of the same sensors (current sensor, voltage sensor).

Figure 8:
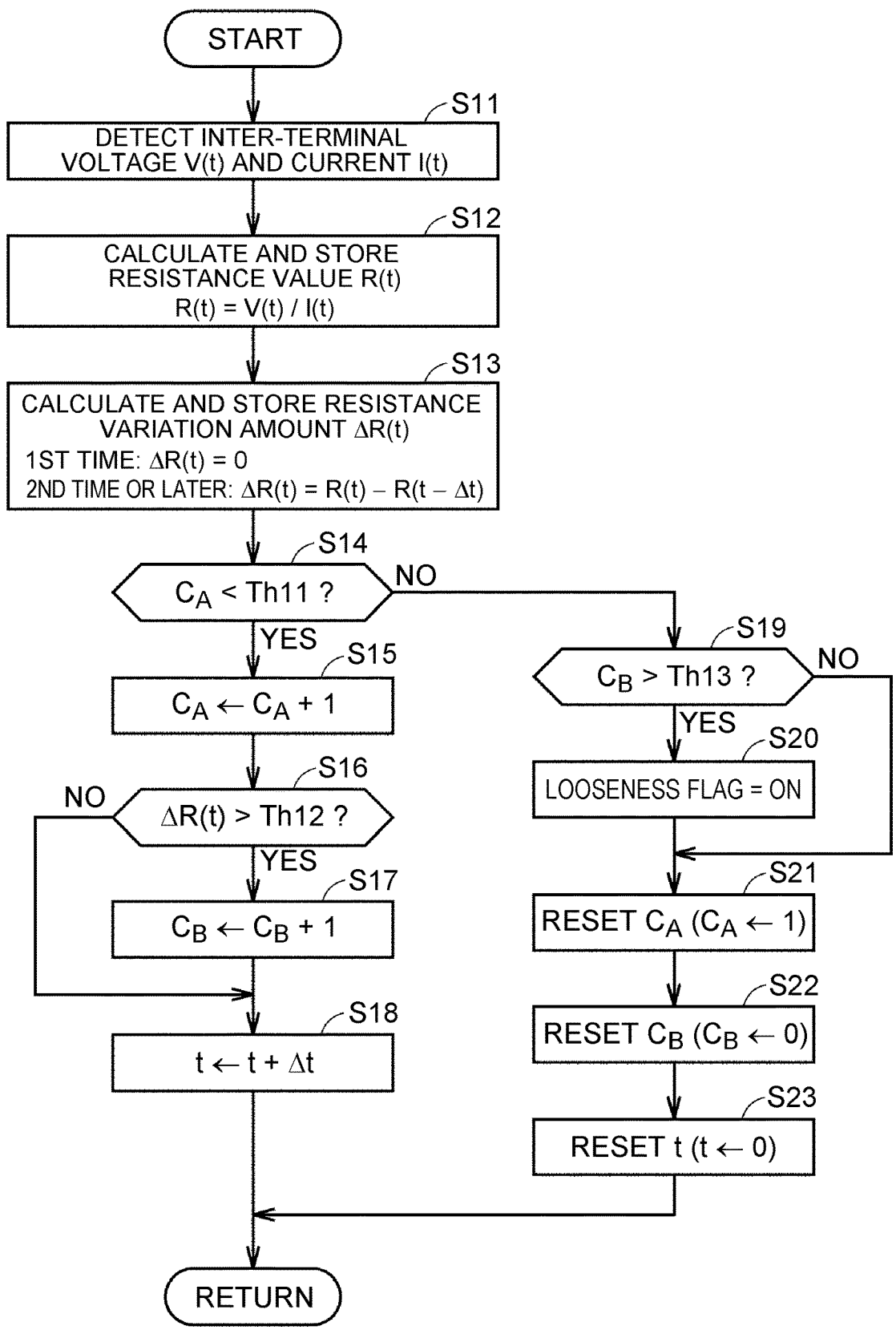
FIG. 8 is a flowchart showing the procedure of a process for detecting looseness of fastening that is executed by the electric storage system according to the first embodiment of the present disclosure.

Hereinafter, the process for detecting looseness of fastening performed by the ECU 300 will be described in detail with FIG. 8. FIG. 8 is a flowchart showing procedures of the process for detecting looseness of fastening executed by the ECU 300 in the situation where no looseness of fastening occurs. The process shown in this flowchart is invoked from a main routine and repeatedly executed at each specified time (for example, each cycle time of the CPU 301).

The memory 302 stores a variable t (hereinafter, also simply referred to as "t") that represents detection timing of a resistance variation amount $\Delta R(t)$, a variable $C_A$ (hereinafter, referred to as "detection count $C_A$", or simply "$C_A$") that represents a detection count of the resistance variation amount $\Delta R(t)$, and a variable $C_B$ (hereinafter, referred to as "counted value $C_B$" or simply "$C_B$") that represents the number of times that the resistance variation amount $\Delta R(t)$ exceeds a threshold Th12. In the first embodiment, the initial values of t, $C_A$, and $C_B$ are zero, one, and zero, respectively.

The memory 302 also stores a looseness flag indicative of whether or not looseness of fastening occurs. The looseness flag is set to a value of one (hereinafter, referred to as "ON") or a value of zero (hereinafter, referred to as "OFF"), with the initial value being OFF. In the situation where no looseness of fastening occurs, the looseness flag is set to OFF in the memory 302.

The memory 302 also stores thresholds Th11 to Th13 used in the process of FIG. 8. The thresholds Th11 to Th13 may be set to any values. Appropriate thresholds Th11 to Th13 may be obtained in advance by an experiment, or the like. The thresholds Th11 to Th13 may be fixed values independent of each other, or may be variables in accordance with the situation, or the like, of the vehicle 1.

In the detection period of $C_B$, the process of FIG. 8 is repeatedly executed so as to count $C_B$. In the first embodiment, the detection period of $C_B$ is set in accordance with the threshold Th11 for $C_A$. The threshold Th11 is set such that the detection period of $C_B$ is about 30 seconds, for example. When the detection period of $C_B$ expires, it is determined whether or not looseness of fastening occurs based on $C_B$, and t, $C_A$, and $C_B$ are reset (initialized). When it is determined that looseness of fastening occurs, the looseness flag is set to ON.

With reference to FIG. 8, the ECU 300 detects an inter-terminal voltage between the terminal T21 and the terminal T22, and a current flowing between the terminal T21 and the terminal T22 (step S11). Hereinafter, the voltage and the current detected in step S11 are referred to as voltage V(t) and current I(t), respectively.

The ECU 300 detects the voltage V(t) with use of an output (detection value Vb) of the voltage sensor 101, and detects the current I(t) with use of an output (detection value Ib) of the current sensor 102. The ECU 300 then stores the acquired voltage V(t) and current I(t) in the memory 302.

Next, the ECU 300 calculates electric resistance between the terminal T21 and the terminal T22 by dividing the voltage V(t) by the current I(t) (step S12). The ECU 300 then stores the acquired electric resistance in the memory 302. Hereinafter, the electric resistance calculated by the process executed at a present time in step S12 is referred to as "resistance value R(t)." In contrast, the electric resistance calculated by the process executed at a previous time in step S12 is referred to as "resistance value $R(t-\Delta t)$" for distinction.

In step S13, the ECU 300 calculates a resistance variation amount $\Delta R(t)$ as a periodic variation parameter by subtracting the resistance value $R(t-\Delta t)$ from the resistance value $R(t)$. However, in the process performed for the first time, the resistance value $R(t-\Delta t)$ is not acquired yet, and therefore the resistance variation amount $\Delta R(t)$ is set to zero (initial value). The resistance variation amount $\Delta R(t)$ corresponds to a difference between the electric resistance detected at a previous time and the electric resistance detected at a present time.

The resistance variation amount $\Delta R(t)$ is not limited to the above-described difference, and may be any parameter as long as the parameter indicates the variation degree of electric resistance. For example, the resistance variation amount $\Delta R(t)$ may be a ratio of the electric resistance detected at the previous time to the electric resistance detected at the present time (resistance value $R(t)$/resistance value $R(t-\Delta t)$, or resistance value $R(t-\Delta t)$/resistance value $R(t)$).

In step S14, the ECU 300 determines whether or not the detection period of $C_B$ expires. More specifically, the ECU 300 determines whether or not the detection count $C_A$ is smaller than the threshold Th11.

In step S15, the ECU 300 increments the detection count $C_A$ by one. That is, $C_A$ is updated to a value obtained by adding one to a present value.

In step S16, the ECU 300 determines whether or not the resistance variation amount $\Delta R(t)$ acquired in step S13 is larger than the threshold Th12. When the resistance variation amount $\Delta R(t)$ is larger than the threshold Th12 (YES in step S16), the ECU 300 increments (counts up) the count value $C_B$ by one in step S17, and then the process proceeds to step S18. That is, $C_B$ is updated to a value obtained by adding one to the present value. On the other hand, when the resistance variation amount $\Delta R(t)$ is equal to or less than the threshold Th12 (NO in step S16), the process proceeds to step S18, without the ECU 300 performing the above-described count-up (step S17).

In step S18, the ECU 300 adds a control period $\Delta t$ to a variable t. The control period $\Delta t$ is set, for example, as a cycle time of the CPU 301. That is, t is updated to a value obtained by adding the control period $\Delta t$ to the present value. Then, the process is returned to the main routine.

When determining that the detection count $C_A$ is smaller than the threshold Th11 in step S14 (YES in step S14), the ECU 300 determines that the detection period of $C_B$ does not expire. While determining that the detection count $C_A$ is smaller than the threshold Th11, the ECU 300 repeatedly executes the process of steps S11 to S18. The ECU 300 detects the resistance variation amount $\Delta R(t)$ in steps S11 to S13, and counts the number of times ($C_B$) that the resistance variation amount $\Delta R(t)$ exceeds the threshold Th12 in steps S16 to S17.

When determining that the detection count $C_A$ is equal to or more than the threshold Th11 in step S14 (NO in step S14), the ECU 300 determines that the detection period of $C_B$ expires, and the process proceeds to step S19.

In step S19, the ECU 300 determines whether or not looseness of fastening occurs in the detection range (a region between the terminal T21 and the terminals T22). More specifically, the ECU 300 determines whether or not the count value $C_B$ is larger than the threshold Th13. When the count value $C_B$ is larger than the threshold Th13 (YES in step S19), the ECU 300 sets the looseness flag to ON in step S20, and then the process proceeds to step S21. On the other hand, when the count value $C_B$ is equal to or less than the threshold Th13 (NO in step S19), the process proceeds to step S21, without the ECU 300 performing the above-described flag setting (step S20).

In steps S21, S22, S23, the ECU 300 resets $C_A$, $C_B$, and t, respectively. Thus, $C_A$, $C_B$, and t are returned to initial values (one, zero, zero). Then, the process returns to the main routine.

According to the process in FIG. 8, when looseness of fastening occurs in the detection range during traveling of the vehicle 1, it becomes possible to find that the count value $C_B$ becomes larger than the threshold Th13, and to detect the looseness of fastening before a rapid increase in the electric resistance. In such a method, whether or not looseness of fastening occurs is determined based on the cumulative calculation value (number of times). Hence, erroneous detection attributed to disturbance (noise etc.) hardly occurs.

In such a method, when the vehicle 1 vibrates at a high frequency, looseness of fastening can be detected with high precision.

The user can find whether or not looseness of fastening occurs in the detection range based on the value of the looseness flag in the memory 302. When the looseness flag is set to ON, it means that the looseness of fastening occurs in a fastening part (that is, at least one of the terminals T21, T22) that is present in the detection range.

The ECU 300 may be configured to notify that the looseness of fastening occurs when the looseness flag is set to ON. For example, the ECU 300 may display on the display device 400 information (characters, images, or the like) notifying a user that the looseness of fastening occurs. Any method may be used for notifying the user, such as a method notifying with sound, and a method notifying with lighting (including flashing) a specified lamp.

The ECU 300 may also be configured to record the occurrence of looseness of fastening when the looseness flag is set to ON. For example, the ECU 300 may record on the memory 302 the occurrence of looseness of fastening by setting a flag (flag corresponding to the detection range) of diagnosis (self-diagnosis) in the memory 302 to ON (changing the value of the flag from zero to one).

the ECU 300 may also be configured to perform current limiting in the assembled battery 100 when the looseness flag is set to ON. For example, the ECU 300 may control the PCU 140, the SMR 150, or the like to keep input-output current of the assembled battery 100 within a specified limit value. In an electric storage system that performs the above-described current limiting even in the situation where no looseness of fastening occurs, the ECU 300 may set a smaller limit value when the looseness flag is set to ON so as to perform more severe current limiting. It also becomes possible to suppress generation of heat in a fastening part (by extension, temperature increase around the fastening part) by performing the current limiting in the assembled battery 100. Thus, the components around the fastening part can be protected.

The ECU 300 may perform only the notifying and recording, or may perform only the current limiting. The ECU 300 may also perform all the notifying, recording, and current limiting. The ECU 300 may perform the process up to setting of the looseness flag, and the subsequent process may be performed by a user.

Description is now given of an electric storage system according to a second embodiment of the present disclosure. Since the second embodiment is similar to the first embodiment in many points, description is mainly given of their differences, while description of the similar points is omitted.

Basically, the electric storage system according to the second embodiment has a configuration in compliance with the electric storage system according to the first embodiment. However, in the electric storage system according to the second embodiment, the ECU 300 is configured to perform a process of FIG. 9 instead of the process of FIG. 8. Hereinafter, the process for detecting looseness of fastening performed by the ECU 300 in the second embodiment will be described in detail with FIG. 9.

Figure 9:
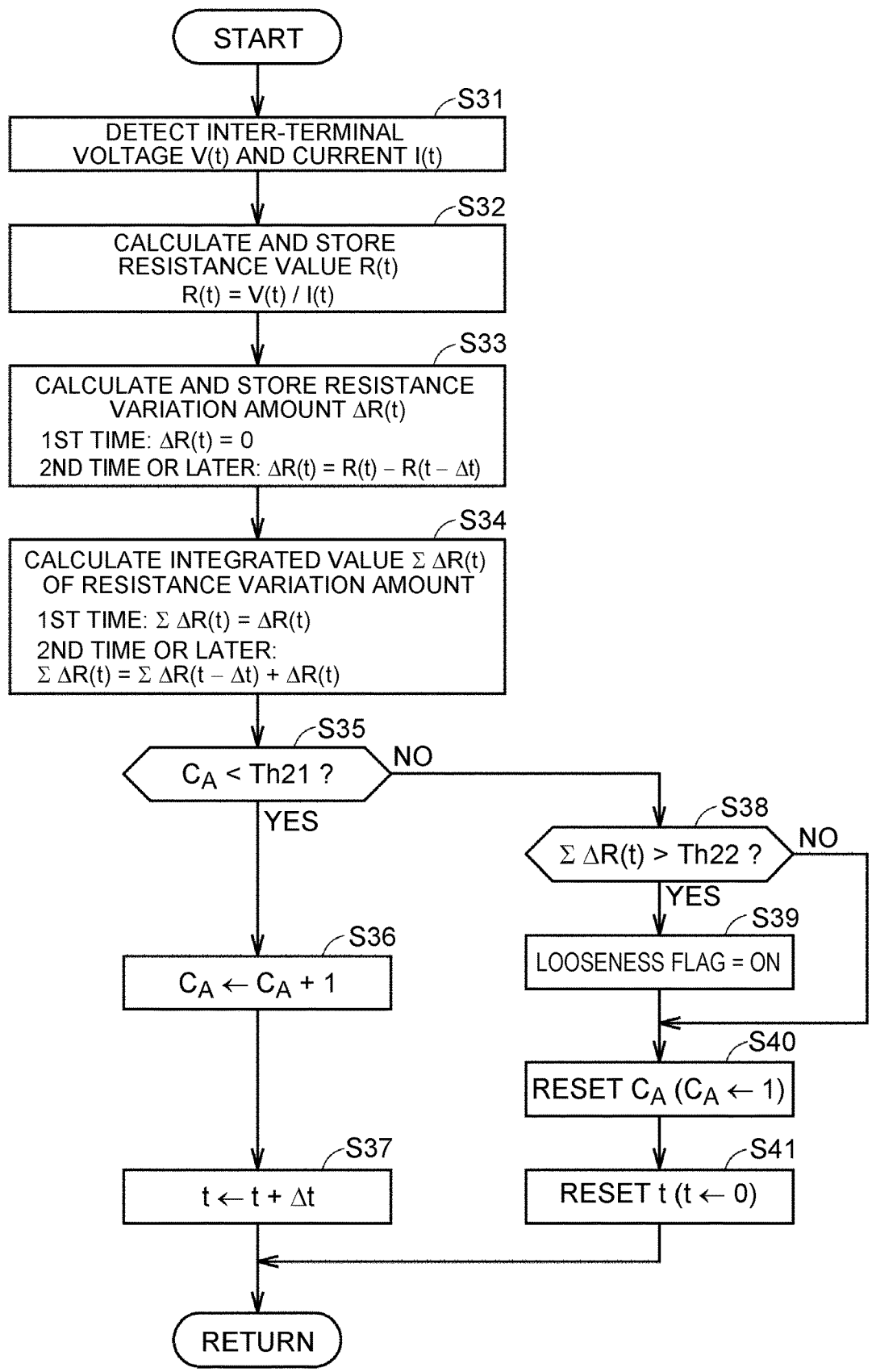
FIG. 9 is a flowchart showing the procedure of a process for detecting looseness of fastening that is executed by an electric storage system according to a second embodiment of the present disclosure.

FIG. 9 is a flowchart showing procedures of the process for detecting looseness of fastening executed by the ECU 300 in the situation where no looseness of fastening occurs. The process shown in this flowchart is invoked from a main routine and repeatedly executed at each specified time (for example, each cycle time of the CPU 301).

The second embodiment, as in the first embodiment, t and $C_A$ are used. However, in the second embodiment, $C_B$ is not used. The memory 302 stores thresholds Th21, Th22 used in the process of FIG. 9 instead of the thresholds Th11 to Th13. The thresholds Th21, Th22 may be set to any values. Appropriate thresholds Th21, Th22 may be obtained in advance by an experiment, or the like. The thresholds Th21, Th22 may be fixed values independent of each other, or may be variables in accordance with the situation, or the like, of the vehicle 1.

In the second embodiment, an integrated value $\Sigma\Delta R(t)$ of the resistance variation amount $\Delta R(t)$ is adopted, instead of the number of times that the resistance variation amount $\Delta R(t)$ exceeds a threshold (first embodiment), as a periodic variation parameter. In a detection period of the integrated value $\Sigma\Delta R(t)$, the process of FIG. 9 is repeatedly executed to calculate the integrated value $\Sigma\Delta R(t)$. In the second embodiment, the detection period of the integrated value $\Sigma\Delta R(t)$ is set by the threshold Th21 for $C_A$. The threshold Th21 is set such that the detection period of the integrated value $\Sigma\Delta R(t)$ is about 30 seconds, for example. When the detection period of the integrated value $\Sigma\Delta R(t)$ expires, it is determined whether or not looseness of fastening occurs based on the integrated value $\Sigma\Delta R(t)$, and t and $C_A$ are reset (initialized). When it is determined that looseness of fastening occurs, the looseness flag is set to ON.

With reference to FIG. 9, the ECU 300 executes steps S31 to S33 in compliance with steps S11 to S13 of FIG. 8. In step S34, the ECU 300 calculates an integrated value $\Sigma\Delta R(t)$ of the resistance variation amount $\Delta R(t)$. Hereinafter, an integrated value of the resistance variation amount calculated by the process executed at a present time in step S34 is referred to as "integrated value $\Sigma\Delta R(t)$." In contrast to this, an integrated value of the resistance variation amount calculated by the process executed at a previous time in step S34 is referred to as "integrated value $\Sigma\Delta R(t-\Delta t)$" for distinction.

In step S34, the integrated value $\Sigma\Delta R(t)$ is calculated by adding the resistance variation amount $\Delta R(t)$ acquired in step S33 to the integrated value $\Sigma\Delta R(t-\Delta t)$ detected at the previous time. However, in the process performed for the first time, the integrated value $\Sigma\Delta R(t-\Delta t)$ is not yet acquired, and therefore, the integrated value $\Sigma\Delta R(t-\Delta t)$ is set to zero (initial value). That is, in the process for the first time, the resistance variation amount $\Delta R(t)$ acquired in step S33 is used as the integrated value $\Sigma\Delta R(t)$.

In steps S35, S36, S37, the process in compliance with steps S14, S15, S18 of FIG. 8 is performed, respectively.

When determining that the detection count $C_A$ is smaller than the threshold Th21 in step S35 (YES in step S35), the ECU 300 determines that the detection period of the integrated value $\Sigma\Delta R(t)$ does not expire. While determining that the detection count $C_A$ is smaller than the threshold Th21, the ECU 300 repeatedly executes the process of steps S31 to S37. In steps S31 to S33, the ECU 300 detects the resistance variation amount $\Delta R(t)$, and in step S34, the integrated value $\Sigma\Delta R(t)$ is calculated (integrated).

When determining that the detection count $C_A$ is equal to or more than the threshold Th21 in step S35 (NO in step S35), the ECU 300 determines that the detection period of the integrated value $\Sigma\Delta R(t)$ expires, and the process proceeds to step S38.

In step S38, the ECU 300 determines whether or not looseness of fastening occurs in the detection range (a region between the terminal T21 and the terminals T22). More specifically, the ECU 300 determines whether or not the integrated value $\Sigma\Delta R(t)$ is larger than the threshold Th22. When the integrated value $\Sigma\Delta R(t)$ is larger than the threshold Th22 (YES in step S38), the ECU 300 sets the looseness flag to ON in step S39, and then the process proceeds to step S40. On the other hand, when the integrated value ΣΔR(t) is equal to or less than the threshold Th22 (NO in step S38), the process proceeds to step S40 without the ECU 300 performing the above-described flag setting (step S39).

In steps S40, S41, the ECU 300 resets $C_A$ and t, respectively. Thus, $C_A$ and t are returned to initial values (one, zero). Then, the process returns to the main routine.

According to the process in FIG. 9, when looseness of fastening occurs in the detection range during traveling of the vehicle 1, the integrated value ΣΔR(t) becomes larger than the threshold Th22. Hence, it becomes possible to detect the looseness of fastening before a rapid increase in the electric resistance. In such a method, whether or not looseness of fastening occurs is determined based on the cumulative calculation value (integrated value). Hence, erroneous detection attributed to disturbance (noise, or the like) hardly occurs. In such a method, when the vehicle 1 vibrates with a large amplitude, looseness of fastening can be detected with high precision.

The user can find whether or not looseness of fastening occurs in the detection range based on the value of the looseness flag in the memory 302. When the looseness flag is set to ON, it means that the looseness of fastening occurs in a fastening part (that is, at least one of the terminals T21, T22) that is present in the detection range. As in the first embodiment, the ECU 300 may perform at least one of notifying, recording, and current limiting, when the looseness flag is set to ON.

In the process shown in each of FIGS. 8 and 9, the detection period of the periodic variation parameter is set based on the detection count (threshold Th11 or Th21) of the resistance variation amount ΔR. However, without being limited to the above, the detection period of the periodic variation parameter may optionally be set. For example, the detection period of the periodic variation parameter may be determined based on lapsed time after the start of detection (for example, threshold for the variable t).

In each of the above embodiments, the detection range is set as a region between the terminal T21 and the terminal T22. However, without being limited to this, the detection range may be set to any region. For example, the detection range may be a region between the positive electrode terminal T11 of the stack S1 and the negative electrode terminal T12 of the stack S2 shown in FIG. 2. The detection range may be expanded such that the detection range includes three or more fastening parts. By expanding the detection range, the number of the fastening parts subjected to looseness detection can be increased, without the necessity of an additional voltage sensor. For example, the detection range may be a region between the negative electrode terminal T1 of the stack S1 and the positive electrode terminal T11 of the stack S1. The detection range may also be a region between the negative electrode terminal of the assembled battery 100 and the positive electrode terminal of the assembled battery 100.

It is also possible to set a plurality of detection ranges, provide a plurality of voltage sensors that each detect an inter-terminal voltage corresponding one of the detection ranges, and perform the process for detecting looseness of fastening (for example, process shown in FIG. 8 or FIG. 9) for each of the detection ranges in parallel.

The configuration of the vehicle 1 to which the above-described electric storage system 2 is applied is not limited to the configuration shown in FIG. 1, but may properly be changed. The configuration of the electric storage device may also properly be changed. For example, the secondary batteries that constitute an electric storage device may be nickel-hydrogen batteries, and may be totally-solid batteries. In addition, a large-capacity capacitor, or the like, may be adopted as an electric storage device.

Figure 10:
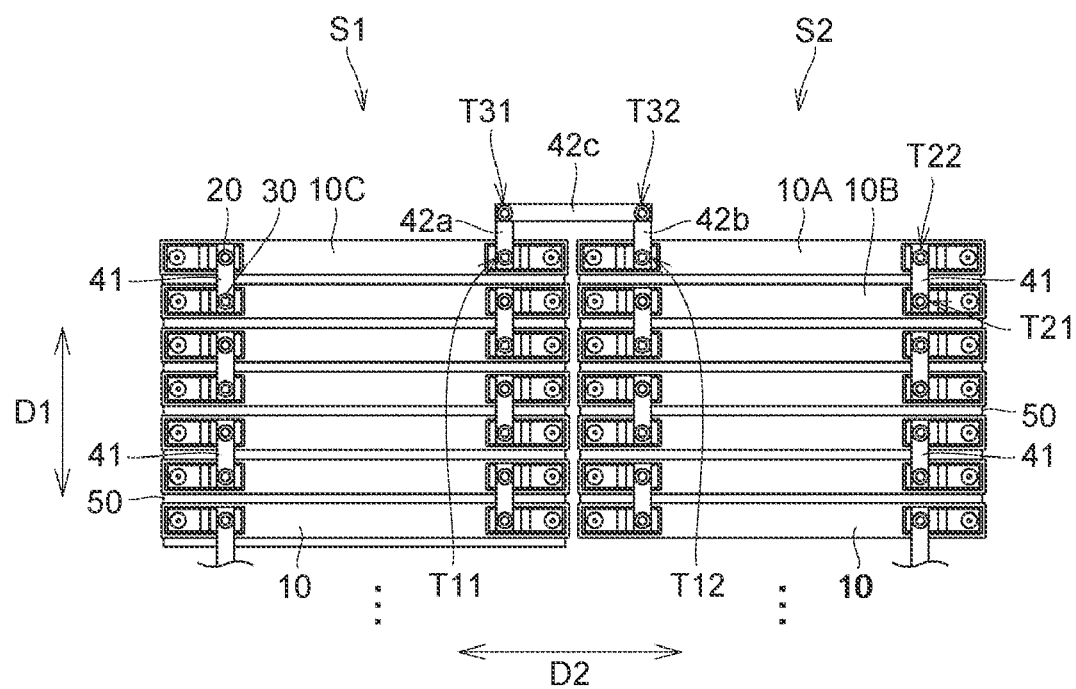
FIG. 10 is a plan view showing a modification of the fastening part in the electric storage system according to the first and second embodiments of the present disclosure.
Figure 11:
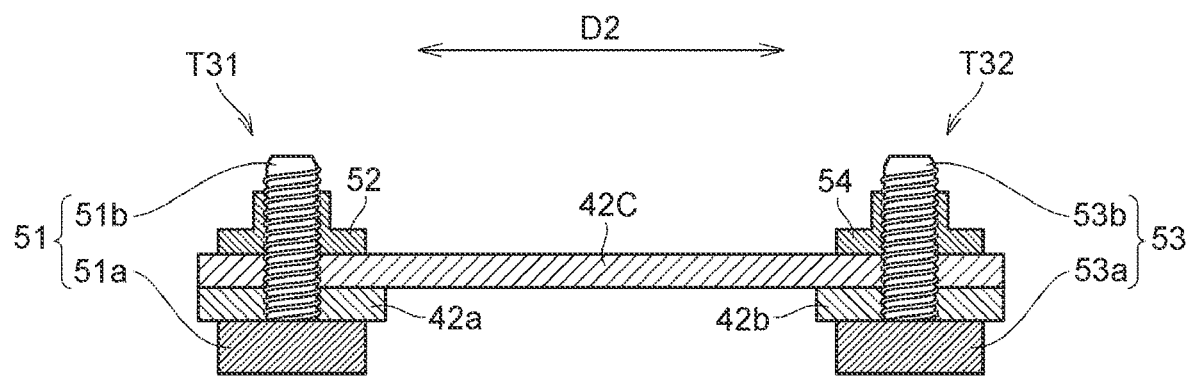
FIG. 11 is a sectional view showing the modification of the fastening parts.

A fastening part, in which the first conductive member and the second conductive member are fastened by fastening members, may be subjected to looseness detection. FIGS. 10 and 11 are a plan view and a sectional view showing such a fastening part, respectively.

With reference to FIG. 10, in this example, a positive electrode terminal T11 of a stack S1 and a negative electrode terminal T12 of a stack S2 are electrically connected with each other through a plurality of conductive members (bus bars 42a, 42b, 42c). The bus bar 42a is fixed to the positive electrode terminal T11 of the stack S1 by fastening members (bolt and nut). The bus bar 42b is fixed to the negative electrode terminal T12 of the stack S2 by the fastening members (bolt and nut).

With reference to FIG. 11, in a terminal T31, the bus bars 42a, 42c (first conductive member and second conductive member) are fastened by a bolt 51 and a nut 52. The bolt 51 includes a head part 51a and a screwing part 51b. The screwing part 51b is inserted into a through-hole formed in each of the bus bars 42a, 42c, such that the bus bars 42a, 42c are interposed between the head part 51a and the nut 52. In a terminal T32, the bus bars 42b, 42c (first conductive member and second conductive member) are fastened by a bolt 53 and a nut 54. The bolt 53 includes a head part 53a and a screwing part 53b. The screwing part 53b is inserted in the through-hole formed in each of the bus bars 42b, 42c, such that the bus bars 42b, 42c are interposed between the head part 53a and the nut 54.

The terminals T31, T32 as described above may be subjected to looseness detection. For example, a voltage sensor may be provided to allow detection of an inter-terminal voltage between the terminal T31 and the terminal T32, and a region between the terminal T31 and the terminals T32 may be set as a detection range. A voltage sensor may also be provided to allow detection of an inter-stack voltage between the positive electrode terminal T11 of the stack S1 and the negative electrode terminal T12 of the stack S2, and a region between the positive electrode terminal T11 of the stack S1 and the negative electrode terminal T12 of the stack S2 may be set as a detection range.

When the bus bars 42a, 42b, 42c are connected as described above, a long conductive member is formed. The conductive member tends to vibrate more, as the conductive member is longer. The aforementioned process for detecting looseness of fastening (for example, process shown in FIG. 8 or FIG. 9) makes it possible to properly detect looseness of fastening of a conductive member with use of vibration of such a conductive member. When vibration of the conductive member causes a large periodic variation degree of the electric resistance, the looseness of fastening is detected.

Any fastening members may be used in the fastening part that is subjected to looseness detection. Fasteners (rivet, and the like) other than bolts and nuts may be used as fastening members. A fastening mode of the fastening part may be any mode. Screw fastening other than bolt-nut fastening (screw fastening without use of a nut, or the like) may be adopted.

It is to be understood that the first and second embodiments disclosed this time are in all respects illustrative and are not considered as the basis for restrictive interpretation. The scope of the present disclosure is defined by the claims and not by the foregoing description of the first and second embodiments. All modifications which come within the scope of the claims and equivalents thereof, are therefore intended to be embraced therein.

What is claimed is:

1. An electric storage system, comprising:
   an electric storage device; and
   an electronic control unit configured to detect electric resistance between a first terminal and a second terminal that are present in a current path of the electric storage device and periodically acquire the electric resistance between the first terminal and the second terminal, the electronic control unit being configured to detect looseness of fastening in a fastening part that is present between the first terminal and the second terminal in the current path, when a summation of times that a variation amount of the periodically acquired electric resistance exceeds a first threshold is larger than a second threshold.

2. The electric storage system according to claim 1, wherein:
   the electronic control unit is configured to detect the electric resistance with use of an output of a voltage sensor and an output of a current sensor, the voltage sensor detecting an inter-terminal voltage between the first terminal and the second terminal, and the current sensor detecting a current flowing between the first terminal and the second terminal; and
   the variation amount of the electric resistance is a difference between electric resistance detected at a previous time and electric resistance detected at a present time.

3. The electric storage system according to claim 1, wherein:
   the electronic control unit is configured to detect the electric resistance with use of an output of a voltage sensor and an output of a current sensor, the voltage sensor detecting an inter-terminal voltage between the first terminal and the second terminal, and the current sensor detecting a current flowing between the first terminal and the second terminal; and
   the variation amount of the electric resistance is a ratio between electric resistance detected at a previous time and electric resistance detected at a present time.

4. An electric storage system, comprising:
   an electric storage device; and
   an electronic control unit configured to detect electric resistance between a first terminal and a second terminal that are present in a current path of the electric storage device and periodically acquire the electric resistance between the first terminal and the second terminal, the electronic control unit being configured to detect looseness of fastening in a fastening part that is present between the first terminal and the second terminal in the current path when a summation of an integrated value of a variation amount of the periodically acquired electric resistance exceeds a threshold.

5. The electric storage system according to claim 4, wherein:
   the electronic control unit is configured to detect the electric resistance with use of an output of a voltage sensor and an output of a current sensor, the voltage sensor detecting an inter-terminal voltage between the first terminal and the second terminal, and the current sensor detecting a current flowing between the first terminal and the second terminal; and
   the variation amount of the electric resistance is a difference between electric resistance detected at a previous time and electric resistance detected at a present time.

6. The electric storage system according to claim 4, wherein:
   the electronic control unit is configured to detect the electric resistance with use of an output of a voltage sensor and an output of a current sensor, the voltage sensor detecting an inter-terminal voltage between the first terminal and the second terminal, and the current sensor detecting a current flowing between the first terminal and the second terminal; and
   the variation amount of the electric resistance is a ratio between electric resistance detected at a previous time and electric resistance detected at a present time.

7. The electric storage system according to claim 1, wherein:
   the first terminal and the second terminal are electrically connected with each other through one conductive member; and
   the first terminal and the second terminal are each fixed to the conductive member by a fastening member.

8. The electric storage system according to claim 1, wherein:
   the electric storage device includes an assembled battery including a plurality of cells; and
   in at least one of the first terminal and the second terminal, a positive electrode or a negative electrode of each of the cells and each of conductive members are fastened by each of fastening members.

9. The electric storage system according to claim 1, wherein in at least one of the first terminal and the second terminal, a first conductive member and a second conductive member that are included in the electric storage device are fastened by a fastening member.

10. The electric storage system according to claim 1, wherein the electronic control unit is configured to perform at least one of notifying occurrence of the looseness of fastening, recording occurrence of the looseness of fastening, and current limiting in the electric storage device, when detecting the looseness of fastening.

11. The electric storage system according to claim 1, wherein:
    the electric storage system is mounted on a vehicle; and
    a periodic variation of the electric resistance is generated by vibration of the vehicle.

12. A detection method of looseness in fastening part of an electric storage system, the electric storage system including an electric storage device, a first terminal and a second terminal that are present in a current path of the electric storage device; and a fastening part between the first terminal and the second terminal, the detection method comprising:
    detecting electric resistance between the first terminal and the second terminal;
    periodically acquiring the electric resistance between the first terminal and the second terminal; and
    detecting looseness of fastening in the fastening part when a summation of times that a variation amount of the periodically acquired electric resistance exceeds a first threshold is larger than a second threshold.

* * * * *